US012785546B2

(12) United States Patent
Yan

(10) Patent No.: US 12,785,546 B2
(45) Date of Patent: Nov. 3, 2026

(54) POWER CONVERTER AND METHOD FOR DETERMINING ABNORMAL TERMINAL OF POWER CONVERTER

(71) Applicant: Huawei Digital Power Technologies Co., Ltd., Shenzhen (CN)

(72) Inventor: Yang Yan, Shenzhen (CN)

(73) Assignee: HUAWEI DIGITAL POWER TECHNOLOGIES CO., LTD., Shenzhen (CN)

( * ) Notice: Subject to any disclaimer, the term of this patent is extended or adjusted under 35 U.S.C. 154(b) by 239 days.

(21) Appl. No.: 18/655,977

(22) Filed: May 6, 2024

(65) Prior Publication Data

US 2024/0388196 A1 Nov. 21, 2024

Related U.S. Application Data

(63) Continuation of application No. PCT/CN2024/077461, filed on Feb. 18, 2024.

(30) Foreign Application Priority Data

May 17, 2023 (CN) ........................ 202310558778.3

(51) Int. Cl.
*H02M 1/00* (2007.01)
*H02M 1/32* (2007.01)
(Continued)

(52) U.S. Cl.
CPC ......... *H02M 1/327* (2021.05); *H02M 1/0067* (2021.05); *H02M 3/04* (2013.01);
(Continued)

(58) Field of Classification Search
CPC ............................ H02M 1/007; H02M 3/1584
See application file for complete search history.

(56) References Cited

U.S. PATENT DOCUMENTS

2003/0048097 A1* 3/2003 Ishihara ................ H02M 3/155
323/285
2013/0169261 A1 7/2013 Fendt et al.
(Continued)

FOREIGN PATENT DOCUMENTS

CN 210780073 U 6/2020
CN 216132579 U 3/2022
(Continued)

*Primary Examiner* — Sisay G Tiku
(74) *Attorney, Agent, or Firm* — Conley Rose, P.C.

(57) ABSTRACT

A power converter includes a plurality of direct current terminals, a plurality of temperature detection units, a plurality of direct current/direct current (DC/DC) conversion circuits, at least one direct current/alternating current (DC/AC) conversion circuit, and a controller. The temperature detection unit is configured to detect a temperature of the direct current terminal. When a highest temperature value in temperatures of the plurality of direct current terminals is greater than a first alarm threshold, a current value of an input current of at least one DC/DC conversion circuit is controlled to decrease. If the highest temperature value decreases to be less than or equal to a first safety threshold after the current value of the input current of the at least one DC/DC conversion circuit is decreased, a signal indicating that the direct current terminal corresponding to the at least one DC/DC conversion circuit is abnormal is output.

20 Claims, 12 Drawing Sheets

(51) Int. Cl.

| | |
|---|---|
| ***H02M 3/04*** | (2006.01) |
| ***H02M 3/158*** | (2006.01) |
| ***H02M 7/44*** | (2006.01) |
| ***H05K 7/20*** | (2006.01) |

(52) U.S. Cl.
CPC .......... *H02M 7/44* (2013.01); *H05K 7/20909* (2013.01); *H05K 7/20945* (2013.01)

(56) References Cited

U.S. PATENT DOCUMENTS

| | | | | |
|---|---|---|---|---|
| 2015/0130440 | A1* | 5/2015 | Kinoshita ............. | H02M 3/158 323/311 |
| 2015/0377808 | A1* | 12/2015 | Hironaka .............. | H02M 7/537 374/185 |
| 2023/0178976 | A1* | 6/2023 | Nakagawa ............. | H02H 5/042 361/106 |
| 2024/0255356 | A1* | 8/2024 | Kuroki ................... | G01K 1/024 |
| 2025/0023456 | A1* | 1/2025 | Yao ....................... | H02J 3/0012 |

FOREIGN PATENT DOCUMENTS

| | | | |
|---|---|---|---|
| CN | 115411703 | A | 11/2022 |
| CN | 116722726 | A | 9/2023 |
| EP | 3291400 | A1 | 3/2018 |
| JP | 2018102080 | A | 6/2018 |
| WO | 2018155848 | A1 | 8/2018 |

* cited by examiner

POWER CONVERTER AND METHOD FOR DETERMINING ABNORMAL TERMINAL OF POWER CONVERTER

CROSS-REFERENCE TO RELATED APPLICATIONS

This is a continuation of International Patent Application No. PCT/CN2024/077461 filed on Feb. 18, 2024, which claims priority to Chinese Patent Application No. 202310558778.3 filed on May 17, 2023. The disclosures of the aforementioned applications are hereby incorporated by reference in their entireties.

TECHNICAL FIELD

This disclosure relates to the field of power conversion device safety, and in particular, to a power converter and a method for determining an abnormal terminal of a power converter.

BACKGROUND

As the environmental crisis and energy crisis become global problems, new energies, such as wind energy and solar energy, have naturally emerged as a key to improving an energy structure and solving energy problems. As an important part of a new energy power generation solution, power converters are developing rapidly toward high efficiency, reliability, and low costs.

The power converter includes an inverter, a converter, and the like, and is configured to perform direct current/direct current (DC/DC) conversion, direct current/alternating current (DC/AC) conversion, alternating current/direct current (AC/DC) conversion, or the like in various scenarios. Different quantities of direct current terminals configured to receive a current input by a pre-stage circuit may be disposed in the power converter based on a specific application scenario. In a process of using the direct current terminal, the direct current terminal may be in poor contact as a result of insecure inserting or loosening. Consequently, temperatures of some terminals keep increasing and the terminals work at a high temperature for a long time. In some extreme cases, the direct current terminals may be burnt. To avoid this situation, an abnormal terminal needs to be located in a manner such as temperature detection, and the abnormal terminal needs to be dealt with in a timely manner, to ensure continuous and stable operation of the power converter.

SUMMARY

This disclosure provides a power converter and a method for determining an abnormal terminal of a power converter, to detect an abnormal terminal and locate the abnormal terminal in a timely manner, so that maintenance personnel perform a maintenance operation on the abnormal terminal of the power converter conveniently, and continuous and stable operation of the power converter is ensured.

According to a first aspect, this disclosure provides a power converter. The power converter includes a plurality of direct current terminals, a plurality of temperature detection units, a plurality of DC/DC conversion circuits, at least one DC/AC conversion circuit, and a controller. Input ends of the plurality of direct current terminals are connected to a direct current source, output ends of the plurality of direct current terminals are correspondingly connected to input ends of the plurality of DC/DC conversion circuits, output ends of the plurality of DC/DC conversion circuits are correspondingly connected to an input end of the at least one DC/AC conversion circuit, and an output end of the at least one DC/AC conversion circuit is configured to connect to a load. The plurality of temperature detection units is configured to detect detected temperatures of the plurality of direct current terminals. The controller controls, in response to that a highest temperature value in the detected temperatures of the plurality of direct current terminals is greater than a first alarm threshold, a current value of an input current of at least one DC/DC conversion circuit in the plurality of DC/DC conversion circuits to decrease, and if the highest temperature value decreases to be less than or equal to a first safety threshold after the current value of the input current of the at least one DC/DC conversion circuit is decreased, outputs a signal indicating that the direct current terminal corresponding to the at least one DC/DC conversion circuit is abnormal, where the first safety threshold is less than or equal to the first alarm threshold. Alternatively, the controller controls, in response to that a highest temperature value in the detected temperatures of the plurality of direct current terminals is greater than a second alarm threshold, current values of input currents of all DC/DC conversion circuits in the plurality of DC/DC conversion circuits to decrease, then controls, in response to that the highest temperature value decreases to be less than or equal to a second safety threshold, the current value of the input current of at least one DC/DC conversion circuit in the plurality of DC/DC conversion circuits to increase, and if the highest temperature value increases to be greater than the second alarm threshold after the current value of the input current of the at least one DC/DC conversion circuit is increased, output a signal indicating that the direct current terminal corresponding to the at least one DC/DC conversion circuit is abnormal, where the second safety threshold is less than or equal to the second alarm threshold.

In this implementation, the temperature values of the plurality of terminals are detected, so that the highest temperature value of the plurality of terminals is obtained. When the highest temperature value exceeds the alarm threshold, it indicates that a temperature of at least one terminal is abnormal. A value of an input current corresponding to a specific terminal is controlled, to observe whether the highest temperature value changes, so that whether the terminal is an abnormal terminal may be determined. In this manner of searching for an abnormal terminal, temperature detection units (such as negative temperature coefficient (NTCs) thermistors) with relatively low costs may be used to perform temperature detection. This effectively reduces use of a chip in the power converter and finds an abnormal terminal in a timely manner.

With reference to the first aspect, in a first possible implementation, the power converter includes a fan, and the controlling, in response to that the highest temperature value in the detected temperatures of the plurality of direct current terminals is greater than the first alarm threshold, the current value of the input current of the at least one DC/DC conversion circuit in the plurality of DC/DC conversion circuits to decrease includes: controlling, in response to that the highest temperature value in the detected temperatures of the plurality of direct current terminals is greater than the first alarm threshold, a rotation speed of the fan to increase, so that the highest temperature value decreases to be less than the first alarm threshold, then controlling the rotation speed of the fan to decrease, and controlling, in response to that the highest temperature value returns to the first alarm threshold, the current value of the input current of the at least one DC/DC conversion circuit in the plurality of DC/DC conversion circuits to decrease.

In this implementation, the rotation speed of the fan is first increased to decrease a temperature of the abnormal terminal, so that the temperature of the abnormal terminal decreases to be less than the alarm threshold, and then the rotation speed of the fan is decreased, so that the temperature of the abnormal terminal is maintained as precisely as possible at the alarm threshold. In this case, when an input current of the abnormal direct current terminal is decreased, a decrease of the highest temperature value may be presented in a shorter time period. This reduces duration consumed in an abnormal terminal detection process.

With reference to any one of the first aspect to the first possible implementation of the first aspect, in a second possible implementation, the power converter includes a fan, and the controlling, in response to that the highest temperature value in the detected temperatures of the plurality of direct current terminals is greater than the second alarm threshold, current values of input currents of all the DC/DC conversion circuits in the plurality of DC/DC conversion circuits to decrease includes: controlling, in response to that the highest temperature value in the detected temperatures of the plurality of direct current terminals is greater than the second alarm threshold, the current values of the input currents of all the DC/DC conversion circuits in the plurality of DC/DC conversion circuits to decrease, and controlling a rotation speed of the fan to increase.

Similarly, when all the input current values are controlled to decrease, the rotation speed of the fan may alternatively be controlled to increase synchronously, so that the temperature of the abnormal terminal decreases rapidly, that is, the highest temperature value decreases to be less than the alarm threshold quickly. In this way, time consumed in the entire abnormal terminal detection process may also be reduced, so that the abnormal terminal is quickly located, and a risk is reduced.

With reference to a second possible implementation of the first aspect, in a third possible implementation, the controlling, in response to that the highest temperature value decreases to be less than or equal to the second safety threshold, the current value of the input current of the at least one DC/DC conversion circuit in the plurality of DC/DC conversion circuits to increase includes: controlling, in response to that the highest temperature value decreases to be less than or equal to the second safety threshold, the rotation speed of the fan to decrease, and then controlling the current value of the input current of the at least one DC/DC conversion circuit in the plurality of DC/DC conversion circuits to increase.

It should be understood that, after the highest temperature value decreases to be less than or equal to the second safety threshold, the rotation speed of the fan is controlled to decrease, to reduce heat dissipation in an entire device, and then the current is increased, to perform abnormality determining logic, so that a temperature increase of the abnormal terminal can be observed more quickly. In this case, increasing a rotation speed of the fan may be returning the rotation speed to an original rotation speed.

With reference to any one of the first aspect to the third possible implementation of the first aspect, in a fourth possible implementation, the controlling a current value of an input current of at least one DC/DC conversion circuit in the plurality of DC/DC conversion circuits to decrease includes: sequentially controlling a current value of an input current of a DC/DC conversion circuit in the plurality of DC/DC conversion circuits to decrease until the highest temperature value decreases to be less than or equal to the first safety threshold after a current value of an input current of an $n^{th}$ DC/DC conversion circuit in the plurality of DC/DC conversion circuits is controlled to decrease.

With reference to any one of the first aspect to the fourth possible implementation of the first aspect, in a fifth possible implementation, the controlling the current value of the input current of the at least one DC/DC conversion circuit in the plurality of DC/DC conversion circuits to increase includes: sequentially controlling a current value of an input current of a DC/DC conversion circuit in the plurality of DC/DC conversion circuits to increase until the highest temperature value increases to be greater than the second alarm threshold after a current value of an input current of an $m^{th}$ DC/DC conversion circuit in the plurality of DC/DC conversion circuits is controlled to increase.

With reference to any one of the first aspect to the fifth possible implementation of the first aspect, in a sixth possible implementation, the controller is configured to: after outputting a signal indicating that the direct current terminal corresponding to one DC/DC conversion circuit in the plurality of DC/DC conversion circuits is abnormal, control a current value of an input current of the one DC/DC conversion circuit to decrease.

According to a second aspect, this disclosure provides a grid power supply system. The grid power supply system includes a power supply and the power converter according to any one of the first aspect and the possible implementations of the first aspect. The power supply is configured to provide a direct current voltage input for the power converter. The power converter is configured to perform direct current inverse conversion based on the direct current voltage provided by the power supply, and output an alternating current voltage to a load.

According to a third aspect, this disclosure provides a method for determining an abnormal terminal of a power converter. The method is applied to a power converter that includes a plurality of direct current terminals, a plurality of temperature detection units, a plurality of DC/DC conversion circuits, and at least one DC/AC conversion circuit, where input ends of the plurality of direct current terminals are connected to a direct current source, output ends of the plurality of direct current terminals are correspondingly connected to input ends of the plurality of DC/DC conversion circuits, output ends of the plurality of DC/DC conversion circuits are correspondingly connected to an input end of the at least one DC/AC conversion circuit, and an output end of the at least one DC/AC conversion circuit is configured to connect to a load. The plurality of temperature detection units is configured to detect detected temperatures of the plurality of direct current terminals. The method includes: controlling, when a highest temperature value in the detected temperatures of the plurality of direct current terminals is greater than a first alarm threshold, a current value of an input current of at least one DC/DC conversion circuit in the plurality of DC/DC conversion circuits to decrease, and if the highest temperature value decreases to be less than or equal to a first safety threshold after the current value of the input current of the at least one DC/DC conversion circuit is decreased, outputting a signal indicating that the direct current terminal corresponding to the at least one DC/DC conversion circuit is abnormal, where the first safety threshold is less than or equal to the first alarm threshold; or controlling, when a highest temperature value in the detected temperatures of the plurality of direct current terminals is greater than a second alarm threshold, current values of input currents of all DC/DC conversion circuits in the plurality of DC/DC conversion circuits to decrease, and controlling, when the highest temperature value decreases to be less than or equal to the second safety threshold, a current value of an input current of at least one DC/DC conversion circuit in the plurality of DC/DC conversion circuits to increase, and if the highest temperature value increases to be greater than the second alarm threshold after the current value of the input current of the at least one DC/DC conversion circuit is increased, outputting a signal indicating that the direct current terminal corresponding to the at least one DC/DC conversion circuit is abnormal, where the second safety threshold is less than or equal to the second alarm threshold.

With reference to the third aspect, in a first possible implementation, the power converter includes a fan. In the method, the controlling, when a highest temperature value in the detected temperatures of the plurality of direct current terminals is greater than a first alarm threshold, a current value of an input current of at least one DC/DC conversion circuit in the plurality of DC/DC conversion circuits to decrease includes: controlling, when the highest temperature value in the detected temperatures of the plurality of direct current terminals is greater than the first alarm threshold, a rotation speed of the fan to increase, so that the highest temperature value decreases to be less than the first alarm threshold, then controlling the rotation speed of the fan to decrease, and controlling, when the highest temperature value returns to the first alarm threshold, the current value of the input current of the at least one DC/DC conversion circuit in the plurality of DC/DC conversion circuits to decrease.

With reference to the third aspect, in a second possible implementation, the power converter includes a fan. In the method, the controlling, when a highest temperature value in the detected temperatures of the plurality of direct current terminals is greater than a second alarm threshold, current values of input currents of all DC/DC conversion circuits in the plurality of DC/DC conversion circuits to decrease includes: controlling, when the highest temperature value in the detected temperatures of the plurality of direct current terminals is greater than the second alarm threshold, the current values of the input currents of all the DC/DC conversion circuits in the plurality of DC/DC conversion circuits to decrease, and controlling a rotation speed of the fan to increase.

With reference to the first possible implementation of the third aspect, in a third possible implementation, in the method, the controlling, when the highest temperature value decreases to be less than or equal to the second safety threshold, a current value of an input current of at least one DC/DC conversion circuit in the plurality of DC/DC conversion circuits to increase includes: controlling, when the highest temperature value decreases to be less than or equal to the second safety threshold, the rotation speed of the fan to decrease, and then controlling the current value of the input current of the at least one DC/DC conversion circuit in the plurality of DC/DC conversion circuits to increase.

With reference to the third aspect to the third possible implementation of the third aspect, in a fourth possible implementation, in the method, the controlling a current value of an input current of at least one DC/DC conversion circuit in the plurality of DC/DC conversion circuits to decrease includes: sequentially controlling a current value of an input current of a DC/DC conversion circuit in the plurality of DC/DC conversion circuits to decrease until the highest temperature value decreases to be less than or equal to the first safety threshold after a current value of an input current of an $n^{th}$ DC/DC conversion circuit in the plurality of DC/DC conversion circuits is controlled to decrease.

With reference to the third aspect to the fourth possible implementation of the third aspect, in a fifth possible implementation, in the method, the controlling the current value of the input current of the at least one DC/DC conversion circuit in the plurality of DC/DC conversion circuits to increase includes: sequentially controlling a current value of an input current of a DC/DC conversion circuit in the plurality of DC/DC conversion circuits to increase until the highest temperature value increases to be greater than the second alarm threshold after a current value of an input current of an $m^{th}$ DC/DC conversion circuit in the plurality of DC/DC conversion circuits is controlled to increase.

DESCRIPTION OF EMBODIMENTS

The photovoltaic inverter and the photovoltaic system provided in this disclosure are applicable to various application scenarios such as a field of new energy power generation, a field of peak regulation and frequency regulation of power generation, and a field of power supply of important devices. This may be determined based on an actual application scenario, and is not limited herein. The photovoltaic inverter and the photovoltaic system provided in this disclosure are applicable to different scenarios such as a large photovoltaic power station, industrial and commercial photovoltaic power generation, and household photovoltaic power generation. This is not limited herein. The following uses an application scenario in which an inverter in a photovoltaic power supply environment is controlled as an example for description. Details are not described in the following again.

According to the technical solution provided in embodiments of this disclosure, an abnormal direct current terminal of a power converter can be quickly responded to, and the abnormal terminal can be quickly located, so that maintenance personnel perform a subsequent maintenance operation on the abnormal terminal conveniently. It should be understood that the power converter in this disclosure includes power converters configured to perform DC/DC conversion, DC/AC conversion, and AC/DC conversion in various scenarios, such as an inverter and a converter, and the like. For ease of description, in embodiments of this disclosure, the technical solution of this disclosure is described by using an application scenario of a photovoltaic inverter as an example. Details are not described in the following again.

For ease of understanding, terms in embodiments of this disclosure are first explained.

PV means a polar photovoltaic panel.

Direct current terminal means a terminal that is in a photovoltaic inverter and that is configured to receive a direct current input of a PV or a direct current input of an energy storage apparatus.

NTC means a negative temperature coefficient thermistor.

Connection should be understood in a broad sense. For example, if A is connected to B, A may be directly connected to B, or A and B can be indirectly connected through an intermediate medium.

The following clearly describes specific implementations of this disclosure with reference to the accompanying drawings.

Figure 1:
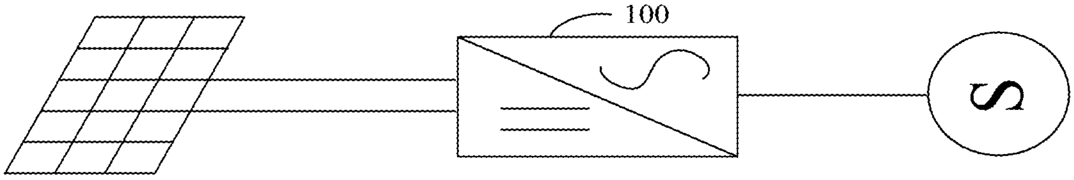
FIG. 1 is a schematic diagram of an application scenario of a power converter according to an embodiment of this disclosure.

An application scenario in which a photovoltaic power generation system is directly connected to a grid is used. As shown in FIG. 1, a power supply of a power converter 100 is a PV. The PV may convert solar energy into electric energy, and output a direct current to the power converter 100. The power converter 100 performs, based on the direct current provided by the PV, corresponding power conversion generally including DC/DC conversion and DC/AC conversion, to convert the input direct current into an alternating current, and output the alternating current to a load. The load may be a grid, or may be a home electric device.

It should be understood that, in actual application, before the direct current output by the PV is input to the power converter, the direct current may further pass through one DC/DC unit, so that a voltage and a frequency of the direct current received by the power converter 100 are within an adaptation range of the power converter 100. Because a setting of the DC/DC unit is not directly related to the technical solution provided in this disclosure, details are not described in embodiments of this disclosure.

Figure 2:
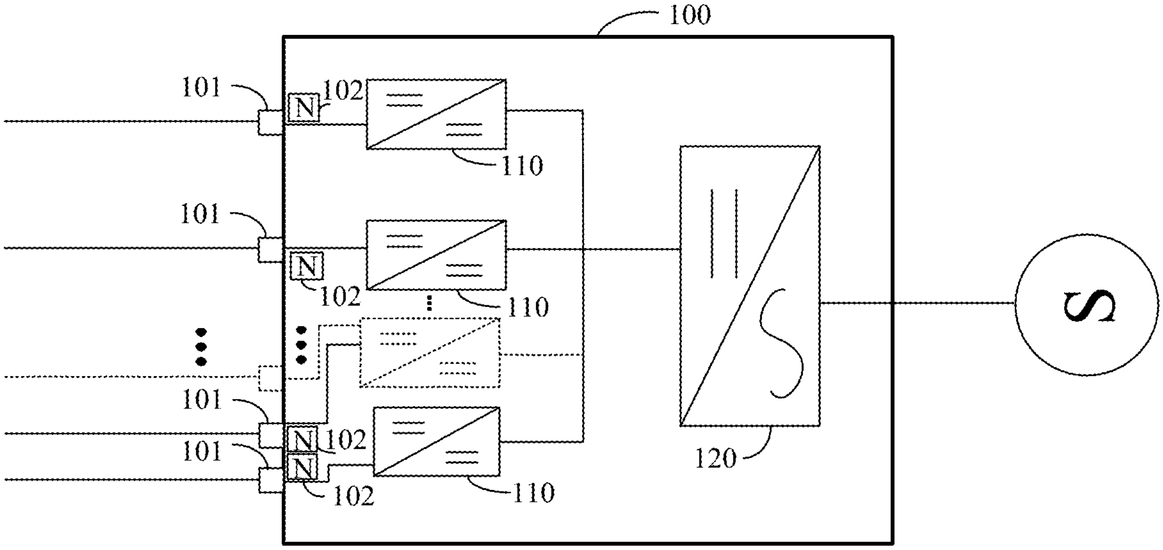
FIG. 2 is a schematic diagram of a structure of a power converter according to an embodiment of this disclosure.

For a power converter provided in this embodiment of this disclosure, refer to FIG. 2 in the accompanying drawings of this specification. A power converter 100 includes a plurality of direct current terminals 101 configured to receive a direct current input by a direct current source, for example, a PV. Each direct current terminal 101 has a corresponding DC/DC conversion circuit 110. The DC/DC conversion circuit 110 may perform direct current voltage conversion on the direct current input by the direct current terminal 101, and then input direct current on which the direct current voltage conversion is performed to a DC/AC conversion circuit 120. The DC/AC conversion circuit 120 may convert a direct current received from the DC/DC conversion circuit 110 into an alternating current required by an external load, so that an entire power supply system supplies power to the load. Because the direct current terminal 101 is generally mechanically connected by using a conducting wire led from the PV side manually, the terminal may be loose as a result of an error during manual installation, an accidental collision, or the like. A loose direct current terminal 101 accompanied by a large current input may cause a temperature of the direct current terminal 101 to increase and consequently damage the direct current terminal 101 or even the entire power converter 100. Therefore, the temperature detection unit 102 needs to be configured to perform temperature detection on the direct current terminal 101 of the power converter 100. When the direct current terminal 101 is abnormal, a current value of an input current of the DC/DC conversion circuit 110 is adjusted in a timely manner, so that the temperature of the direct current terminal 101 decreases.

In this embodiment provided in this disclosure, a plurality of temperature detection units 102 may use NTCs with relatively low costs (for example, surface mount NTCs). The NTCs may perform temperature detection on direct current terminals 101 corresponding to the NTCs, to obtain a plurality of pieces of temperature data. The NTCs can transfer only temperature data, and cannot transfer information about which specific direct current terminal 101 corresponds to a piece of temperature data. Therefore, whether a direct current terminal in the plurality of direct current terminals 101 of the power converter 100 is abnormal may be determined based on a highest temperature value in the plurality of pieces of temperature data, and then each direct current terminal 101 is screened step by step. The highest temperature value may be obtained by using a competition circuit. Because the competition circuit is a common means used by a person skilled in the art to obtain a largest value of data in a data group, details are not described herein again.

In a possible implementation, a first alarm threshold may first be preset, and the first alarm threshold may be obtained by performing related production compliance testing on the power converter 100. When the highest temperature value in the plurality of pieces of temperature data exceeds the first alarm threshold, it indicates that a direct current terminal in the plurality of direct current terminals 101 is abnormal. The abnormal terminal may have a problem of not being securely inserted during manual inserting, or the abnormal terminal may have a problem of being loose as a result of collision with an external object or an excessively long use time, or a temperature of the terminal is abnormal as a result of electrical aging of the terminal.

It may be understood that, if an input current of a DC/DC conversion circuit 110 corresponding to a normal direct current terminal 101 is decreased after the highest temperature value exceeds the first alarm threshold, although a temperature value of the direct current terminal 101 may decrease, because the temperature of the normal direct current terminal 101 is not the highest temperature value, the highest temperature value in the temperature data presented by the plurality of temperature detection units 102 does not change. Similarly, if the highest temperature value decreases to some extent after current values of input currents of DC/DC conversion circuits 110 corresponding to a specific or several direct current terminals 101 are decreased after the highest temperature value exceeds the first alarm threshold, it may be determined that there is an abnormal terminal in the one or more direct current terminals 101. It may be further understood that, if the highest temperature value does not change after current values of input currents of a plurality of DC/DC conversion circuits 110 are decreased, it indicates that direct current terminals 101 corresponding to the plurality of DC/DC conversion circuits 110 are normal. On the contrary, if the highest temperature value decreases after current values of input currents of a plurality of DC/DC conversion circuits 110 are decreased, it indicates that a range of the abnormal terminal is within a range of direct current terminals 101 corresponding to the plurality of DC/DC conversion circuits 110. It should be noted that, the degree to which the highest temperature value decreases herein may be decreasing to be less than or equal to the first safety threshold. When the highest temperature value decreases to be less than or equal to the first safety threshold, it may be considered that a direct current terminal 101 corresponding to the DC/DC conversion circuit 110 whose current value of the input current is decreased is abnormal.

It may be understood that, it also takes a specific period of time for a temperature of the direct current terminal 101 to decrease. Therefore, a period of time for observation is required. If the corresponding direct current terminal 101 is a unique abnormal terminal, after long enough observation time, the highest temperature value decreases, so that it can be determined that the terminal is abnormal. However, if the observation time is excessively short, the temperature of the terminal may not completely decrease, which may cause a specific probability of misjudgment. However, setting excessively long observation time for accurate determining cannot be performed. If the observation time is excessively long, when the terminal is a non-abnormal terminal, excessive time is wasted. As a result, a pace of obtaining the abnormal terminal through screening is very slow, and time for checking for an abnormal terminal is prolonged. Therefore, a first time threshold may be set based on a safety assurance requirement of an application scenario of the power converter 100 and experimental data and serve as the observation time for the highest temperature value after the current value of the input current is decreased. If the highest temperature value decreases to be less than or equal to the first safety threshold within the first time threshold, it is considered that the direct current terminal 101 corresponding to the DC/DC conversion circuit 110 whose current value of the input current is decreased is the abnormal terminal. If the highest temperature value does not decrease to be less than or equal to the first safety threshold after the first time threshold, the direct current terminal 101 corresponding to the DC/DC conversion circuit 110 is very likely not the abnormal terminal, and an abnormal terminal determining process may be stopped, and abnormality detection determining logic is performed on direct current terminal 101 corresponding to another DC/DC conversion circuits 110. The first safety threshold herein may also be set in advance based on corresponding production compliance experimental testing data. It may be understood that the value varies based on specific structures and use environments of different power converters. This is not limited in this embodiment of this disclosure. The first safety threshold may be less than or equal to the first alarm threshold.

In another possible implementation, when the highest temperature value in the temperature data of the plurality of direct current terminals 101 detected by the NTCs exceeds a specific value, current values of input currents of all the DC/DC conversion circuits 110 may be first decreased. In this way, the currents borne by all the direct current terminals 101 may be first decreased, so that temperatures of both the abnormal and non-abnormal terminals correspondingly decrease, so that device safety of the power converter 100 is ensured as soon as possible. The specific value herein may be a second alarm threshold. It may be understood that, within a period of time after current values of input currents of all the DC/DC conversion circuits 110 are decreased, a highest temperature value gradually decreases. After the highest temperature value decreases to a specific value, it may be considered that temperatures of all the direct current terminals 101 are in a safe state. In this case, a value may be set as a second safety threshold, that is, if the highest temperature value decreases to be less than or equal to the second safety threshold, the temperatures of all the direct current terminals 101 are in the safe state. In this case, if the highest temperature value increases to be greater than the second alarm threshold within a second time threshold existing after a current value of an input current of a specific DC/DC conversion circuit 110 is increased, it indicates that a direct current terminal 101 corresponding to the DC/DC conversion circuit 110 is abnormal, where the second safety threshold may be less than or equal to the second alarm threshold.

It should be noted that, in the foregoing two implementations, because policies for searching for the abnormal terminal are different, occasions and manners of decreasing the input current are also different, and duration in which the highest temperature value is at a high level may also be different. Therefore, values of the first safety thresholds, the second safety thresholds, the first alarm thresholds, the second alarm thresholds, the first time thresholds, and the second time thresholds may be different, and set specific values may alternatively be determined based on a corresponding production compliance requirement and an experimental detection result. This is not limited in this embodiment of this disclosure.

Figure 3:
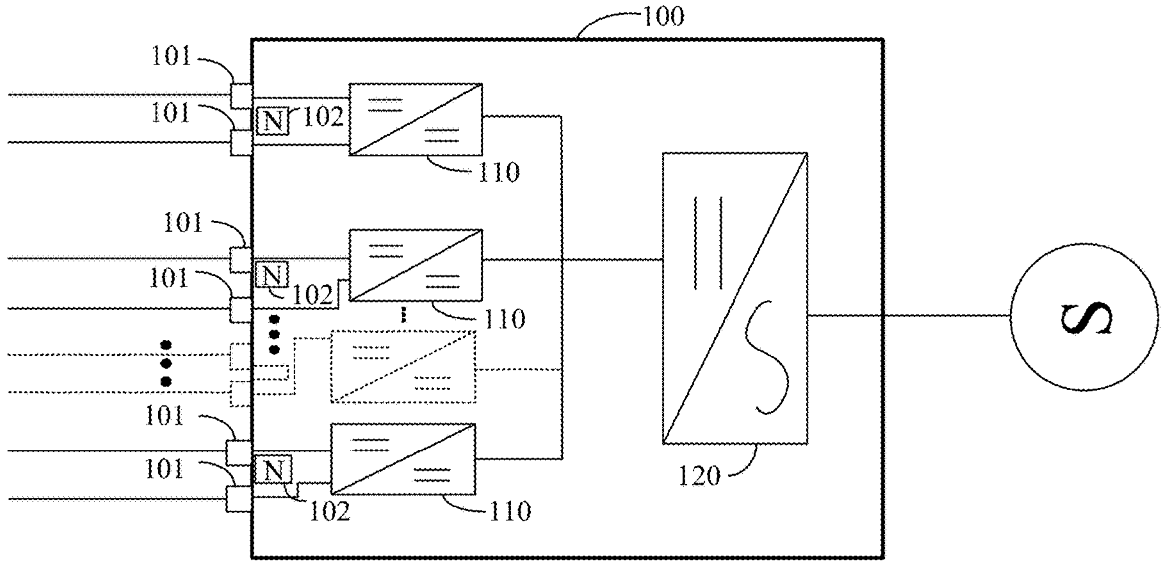
FIG. 3 is a schematic diagram of a structure of a power converter according to an embodiment of this disclosure.

It should be understood that one DC/DC conversion circuit 110 in the power converter 100 may correspond to one temperature detection unit 102 and one direct current terminal 101, as shown in FIG. 2 in the accompanying drawings of this specification. In a specific design of the power converter, a case in which two direct current input terminals 101 correspond to one DC/DC conversion circuit 110 may exist. In this case, a current value of an input current of a DC/DC conversion circuit 110 is controlled to decrease, and input currents borne by two direct current terminals 101 are adjusted simultaneously, that is, temperature values of the two direct current terminals 101 are adjusted simultaneously. In this case, the temperature detection unit 102 may be directly disposed between the two direct current terminals 101 corresponding to the same DC/DC conversion circuit 110, to simultaneously detect the temperature values of the two direct current terminals 101 (certainly, one direct current terminal 101 may alternatively correspond to one temperature detection unit 102, and this is not limited in embodiments of this disclosure). For this design, refer to FIG. 3 in the accompanying drawings of this specification. In this case, the foregoing two implementations are used to check for the abnormal terminal, and a final checking result is two direct current terminals 101 that may be abnormal, where at least one of the two direct current terminals 101 is abnormal. Similarly, the DC/DC conversion circuit 110 may alternatively correspond to inputs of three or more direct current terminals 101, and a location in which the temperature detection unit 102 is disposed may alternatively be flexibly adjusted. Principles of checking for the abnormal terminal are similar, but granularities of checking are different. This is not limited in this embodiment of this disclosure.

Figure 4:
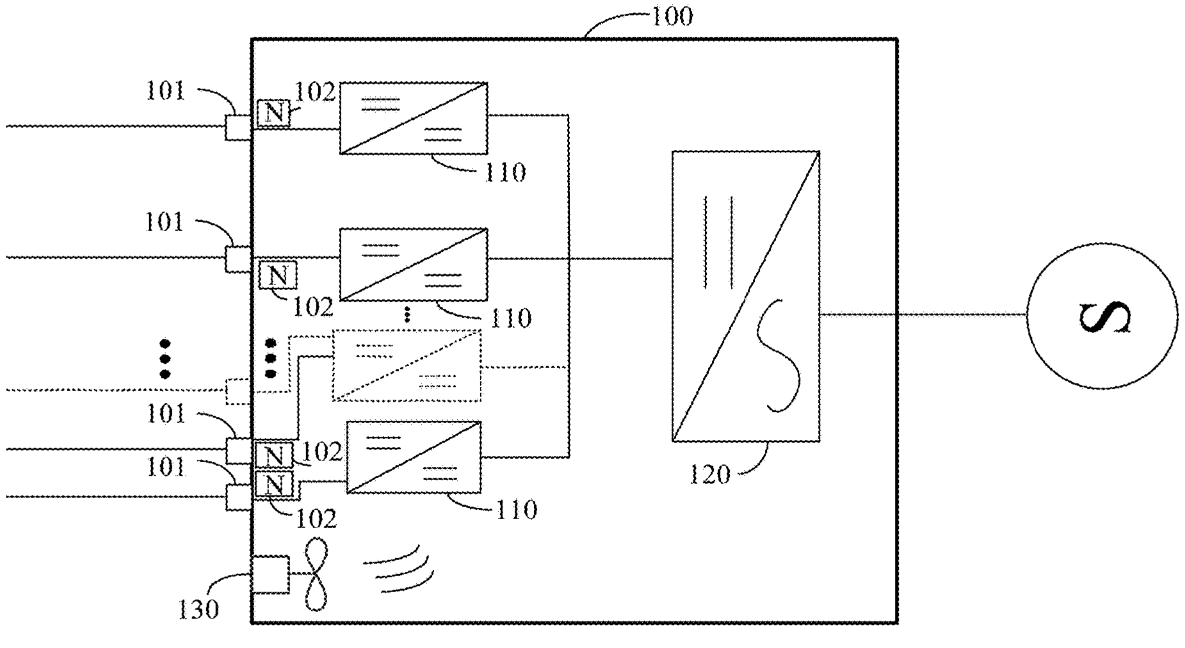
FIG. 4 is a schematic diagram of a structure of a power converter according to an embodiment of this disclosure.

Refer to FIG. 4 in the accompanying drawings of this specification. A power converter 100 provided in this embodiment of this disclosure may include a fan 130. There may be one or more fans 130. This is not limited in this embodiment of this disclosure. The fan 130 may dissipate heat for a power device in the power converter 100 in a process in which the power converter 100 operates normally. When a highest temperature value in temperature data detected by NTCs exceeds a first alarm threshold or a second alarm threshold, the fan 130 may be collaboratively controlled, to increase or decrease a rotation speed, to adjust a heat dissipation speed inside the power converter 100, and adjust a temperature change speed of a direct current terminal 101. The fan 130 may form forced convection between air in the power converter 100 and external air, so that a temperature in the power converter 100 may decrease more quickly, so that a temperature of another part of the power converter 100 decreases accordingly. It should be understood that, rotation of the fan 130 consumes specific electric energy. Therefore, the rotation speed of the fan 130 may be changed flexibly based on factors such as a temperature of the power converter 100, a weather condition, and an ambient temperature, so that the fan 130 achieves a best heat dissipation effect under a most economic condition. Correspondingly, the highest temperature value may also be used as a reference factor for setting the rotation speed of the fan 130. When the controller knows that the highest temperature threshold reaches an alarm threshold, the controller may control the rotation speed of the fan 130 to change, so that the highest temperature value changes and falls within an expected range. Then, a current value of an input current is adjusted, to analyze a change of the highest temperature value, to output a determining result of an abnormal terminal.

In a possible implementation, when the highest temperature value exceeds the first alarm threshold, the rotation speed of the fan 130 may be first controlled to increase, so that the highest temperature value first decreases to be less than the first alarm threshold. In this way, the highest temperature value of the direct current terminals 101 may first decrease to be less than the first alarm threshold, and then a subsequent abnormal terminal detection policy is executed.

Further, after the highest temperature value decreases to be less than the first alarm threshold, a rotation speed of the fan 130 may be decreased, so that the highest temperature value increases to the first alarm threshold. When the highest temperature value increases to the first alarm threshold again, a current value of an input current of the DC/DC conversion circuit is controlled to change. If the highest temperature value decreases to be less than or equal to the first safety threshold within a first time threshold existing after the current value of the input current of the DC/DC conversion circuit is decreased, it indicates that a direct current terminal 101 corresponding to the DC/DC conversion circuit is abnormal. In this implementation, a heat dissipation capability of the fan 130 and heat generated by the abnormal terminal remain in an almost balanced state, that is, a temperature of the abnormal terminal is maintained as precisely as possible at the first alarm threshold. In this way, when the current value of the input current of the DC/DC conversion circuit 110 is decreased subsequently, if the input current corresponds to one abnormal terminal, a decrease of the highest temperature value may be observed more quickly, so that time for determining the abnormal terminal may be reduced, and efficiency of filtering abnormal terminals is improved. Therefore, in an actual application, like the first time threshold is set in the foregoing embodiment, a second time threshold may be set. Because a temperature of the abnormal terminal generally decreases in response to a decrease of a current value of an input current of a DC/DC conversion circuit 110 at a faster speed when the current heat dissipation capability of the fan 130 and heat generated by the direct current terminals 101 are in a relatively balanced state, the second time threshold may be smaller than the first time threshold. However, setting of the second time threshold certainly needs to be based on a comprehensive consideration of a use environment of the power converter 100, a specific design in terms of power and structure, and experimental testing. This is not limited in this embodiment of this disclosure.

In another possible implementation, when the highest temperature value is greater than the second alarm threshold, current values of input currents of all the DC/DC conversion circuits 110 may be decreased, and the rotation speed of the fan 130 is controlled to increase, so that the highest temperature value decreases more quickly to be less than or equal to the second safety threshold. In this way, temperatures of all direct current terminals 101 may decrease, and because the rotation speed of the fan 130 increases, the temperatures of the direct current terminals 101 decrease more quickly, so that all the direct current terminals 101 enter a relatively safe state more quickly. This better guarantees safety of the direct current terminals 101 and the entire power converter 100.

Further, after the highest temperature value decreases to be less than or equal to the second safety threshold, the rotation speed of the fan 130 may be decreased, to reduce power consumption of the fan 130. In this case, all the direct current terminals 101 are in a safe state at a relatively low temperature. In this case, a current value of an input current of any one of all the DC/DC conversion circuits 110 is controlled to increase, and if the highest temperature value increases to be greater than the second alarm threshold within the second time threshold existing after the current value of the input current of the DC/DC conversion circuit 110 is increased, it indicates that a direct current terminal 101 corresponding to the DC/DC conversion circuit 110 is abnormal.

When a current value of an input current of at least one DC/DC conversion circuit 110 is controlled to decrease after the highest temperature value in the temperatures of the plurality of direct current terminals 101 is greater than the first alarm threshold, a current value of an input current of a DC/DC conversion circuit 110 in the plurality of DC/DC conversion circuits 110 may be decreased sequentially (similarly, the rotation speed of the fan 130 may alternatively be first increased previously, so that the highest temperature value decreases to be less than the first alarm threshold, and then a rotation speed of the fan 130 is decreased, so that the highest temperature value returns to the first alarm threshold, and in this case, a heat dissipation capability of the fan 130 and heat generated by the direct current terminals 101 are in a nearly balanced state). For example, the power converter 100 includes a plurality of DC/DC conversion circuits 110 in total, and a current value of an input current of a first DC/DC conversion circuit 110 is first decreased. If a highest temperature value does not change within the first time threshold existing after the current value of the input current of the first DC/DC conversion circuit 110 is decreased, a current value of an input current of a second DC/DC conversion circuit 110 is decreased, and so on, until the highest temperature value decreases to be less than or equal to the first safety threshold within the first time threshold existing after a current value of an input current of an $n^{th}$ DC/DC conversion circuit 110 is decreased. In this case, it indicates that a direct current terminal 101 corresponding to the $n^{th}$ DC/DC conversion circuit is abnormal. Observation time for the highest temperature value after a previous current value is decreased is required between decreasing of current values of input currents of two DC/DC conversion circuits 110. Therefore, an interval between two times of decreasing a current value needs to be greater than or equal to the preset first time threshold, that is, a time interval between decreasing a current value of an input current of a $q^{th}$ DC/DC conversion circuit 110 and decreasing a current value of an input current of a $(q+1)^{th}$ DC/DC conversion circuit 110 is greater than or equal to the first time threshold, where $1 \leq q \leq n-1$, and q is an integer.

In another possible specific embodiment, when the current value of the input current of the at least one DC/DC conversion circuit 110 is controlled to decrease after the highest temperature value in the temperatures of the plurality of direct current terminals 101 is greater than the second alarm threshold, the current values of the input currents of all the DC/DC conversion circuits 110 in the power converter 100 may be decreased, so that the highest temperature value decreases to be less than or equal to the second safety threshold (in this process, the rotation speed of the fan 130 may be increased synchronously to implement a rapid decrease of the highest temperature value, and the rotation speed of the fan 130 may be decreased subsequently to reduce power consumption, as described in the foregoing embodiment), and then current values of input currents of a plurality of DC/DC conversion circuits 110 are increased sequentially until the highest temperature value increases to be greater than the second alarm threshold within the second time threshold existing after a current value of an input current of a specific DC/DC conversion circuit 110 is increased, which indicates that a direct current terminal 101 corresponding to the DC/DC conversion circuit 110 is abnormal. For example, the power converter 100 includes a plurality of DC/DC conversion circuits 110 in total, and a current value of an input current of a first DC/DC conversion circuit 110 is first increased. If a highest temperature value does not change within the second time threshold existing after the current value of the input current of the first DC/DC conversion circuit 110 is increased, a current value of an input current of a second DC/DC conversion circuit 110 is increased, and so on, until the highest temperature value decreases to be less than or equal to the second safety threshold within the second time threshold existing after a current value of an input current of an $m^{th}$ DC/DC conversion circuit 110 is increased, which indicates that a direct current terminal 101 corresponding to the $m^{th}$ DC/DC conversion circuit is abnormal. Observation time for the highest temperature value after a previous current value is increased is required between increasing of current values of input currents of two DC/DC conversion circuits 110. Therefore, an interval between two times of increasing the current value needs to be greater than or equal to the preset second time threshold, that is, a time interval between increasing a current value of an input current of a $p^{th}$ DC/DC conversion circuit 110 and increasing a current value of an input current of a $(p+1)^{th}$ DC/DC conversion circuit 110 is greater than or equal to the second time threshold, where $1 \leq p \leq n-1$, and p is an integer.

Further, after a location of the abnormal terminal is determined by using the foregoing embodiment, a current value of an input current of a DC/DC conversion circuit 110 corresponding to the abnormal terminal may be controlled to decrease or further decrease even to 0, to protect safety of the direct current terminals 101 and the power converter 100.

Figure 5:
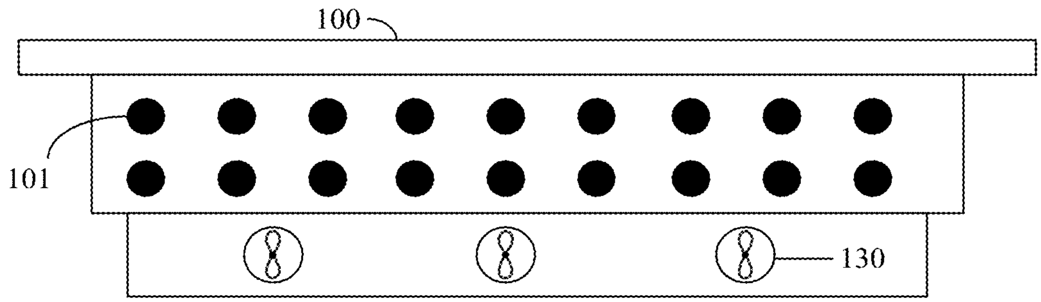
FIG. 5 is a schematic top view of a power converter according to an embodiment of this disclosure.
Figure 6:
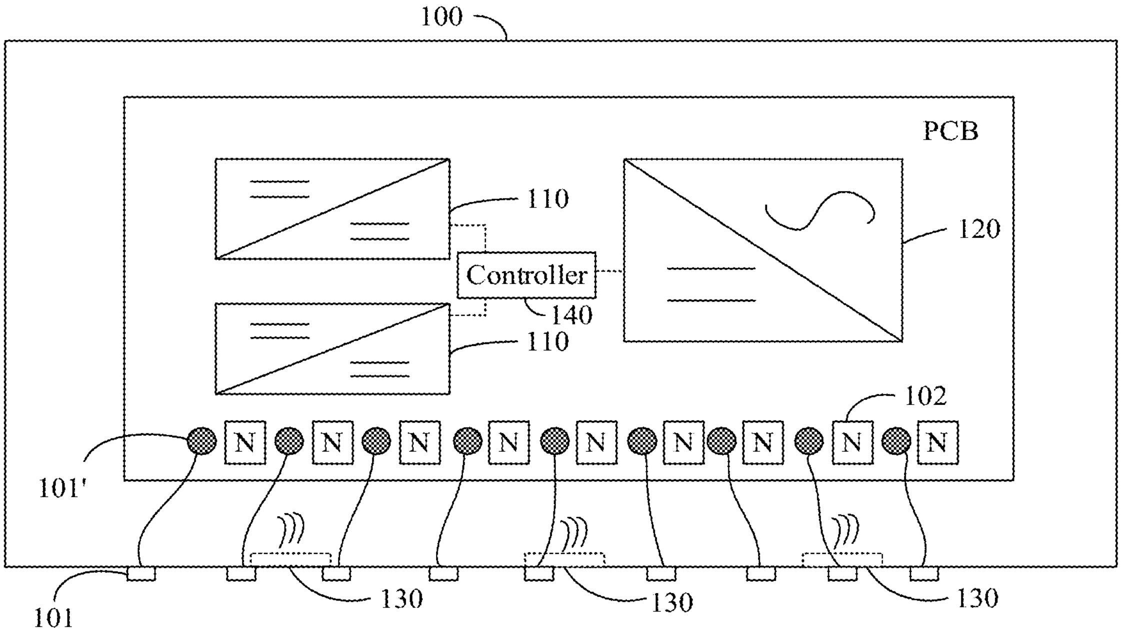
FIG. 6 is a schematic front view of a power converter according to an embodiment of this disclosure.

It should be noted that the foregoing determining logic of the power converter 100 needs to be completed by using one controller. FIG. 5 and FIG. 6 in the accompanying drawings of this specification are respectively a schematic top view and a schematic front view of a power converter 100 according to an embodiment of this disclosure. Each direct current terminal 101 is at a bottom of a power converter 100, and is configured to connect to a direct current cable led from a direct current source. Several fans 130 are respectively disposed at locations adjacent to the direct current terminals 101, and are configured to blow air into a cavity of the power converter 100 to form convection to implement heat dissipation. The direct current terminal 101 also has a corresponding cable inside the power converter 100, and the cable connects the terminal to a corresponding terminal 101' on a printed circuit board (PCB). A circuit inside the PCB may connect a connection point 101' that corresponds to the direct current terminal 101 and that is on the PCB to an input end of the DC/DC conversion circuit 110, or may connect the DC/DC conversion circuit to a DC/AC conversion circuit, and working states of the DC/DC conversion circuit 110 and the DC/AC conversion circuit 120 are controlled by a controller 140 that is communicatively connected to the DC/DC conversion circuit 110 and the DC/AC conversion circuit 120. Abnormal terminal determining logic in the foregoing embodiment may be implemented through controlling by the controller 140. After a corresponding location of the abnormal terminal is obtained through screening, the controller 140 may send a signal indicating that a direct current terminal 101 corresponding to a specific DC/DC conversion circuit 110 is abnormal.

It should be noted that, quantities, locations, and connection relationships of units and components, such as the DC/DC conversion circuit 110, the DC/AC conversion circuit 120, the fan 130, and the direct current terminal 101, in the power conversion circuit 100 described in the accompanying drawings of this specification and embodiments of this disclosure are merely possible examples, and are not intended to limit a structure of the power converter 100 in this disclosure.

Figure 7:
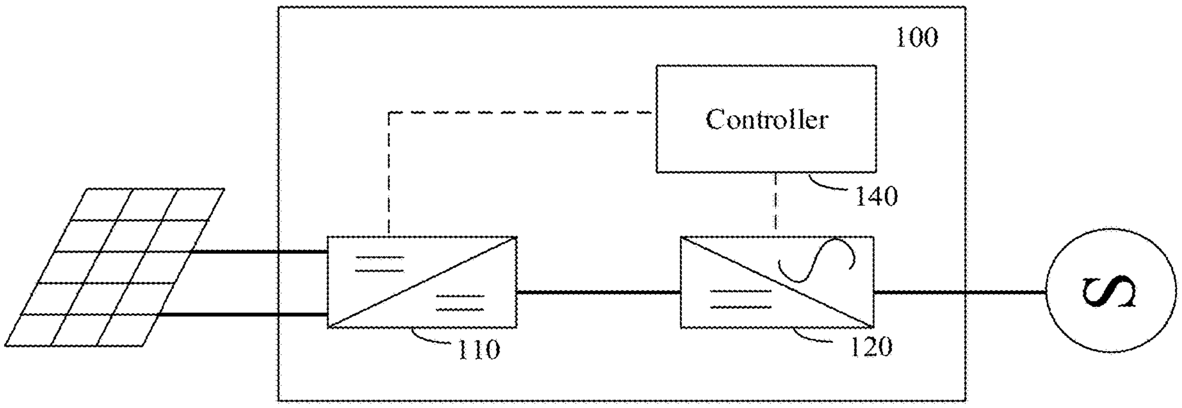
FIG. 7 is a schematic diagram of a grid power supply system according to an embodiment of this disclosure.

An embodiment of this disclosure further provides a grid power supply system. For an architecture of the grid power supply system, refer to FIG. 7. The grid power supply system includes a power supply (for example a PV) and any power converter 100 in the foregoing embodiments. The power supply may provide direct current voltage input for the power converter 100. The power converter 100 is configured to perform direct current inverse conversion based on the direct current voltage provided by the power supply, and output an alternating current voltage to a load.

Based on a same concept, an embodiment of this disclosure further provides a method for determining an abnormal terminal of a power converter. The method is applied to a power converter, and the power converter (which may be the power converter 100 shown in FIG. 2 or the power converter 100 shown in FIG. 3 in the accompanying drawings of this specification) includes a plurality of direct current terminals 101, a plurality of temperature detection units 102, and a plurality of DC/DC conversion circuits 110 and at least one DC/AC conversion circuit 120. Input ends of the plurality of direct current terminals 101 are connected to a direct current source, output ends of the plurality of direct current terminals 101 are correspondingly connected to input ends of the plurality of DC/DC conversion circuits 110, and output ends of the plurality of DC/DC conversion circuits 110 are correspondingly connected to an input end of one (or two or more, which is not limited in this embodiment of this disclosure) DC/AC conversion circuit 120. An output end of the DC/AC conversion circuit 120 is configured to connect to a load. The temperature detection unit 102 is configured to detect a temperature of the direct current terminal 101.

In a possible implementation provided in this embodiment of this disclosure, the method includes the following steps.

When a highest temperature value in temperatures of the plurality of direct current terminals 101 is greater than a first alarm threshold, step S101 is performed.

Step S101: Control a current value of an input current of at least one DC/DC conversion circuit in the plurality of DC/DC conversion circuits to decrease.

If the highest temperature value decreases to be less than or equal to a first safety threshold after the current value of the input current of the at least one DC/DC conversion circuit is decreased, step S102 is performed.

Step S102: Output a signal indicating that the direct current terminal corresponding to the at least one DC/DC conversion circuit is abnormal.

The first safety threshold is less than or equal to the first alarm threshold.

Figure 8:
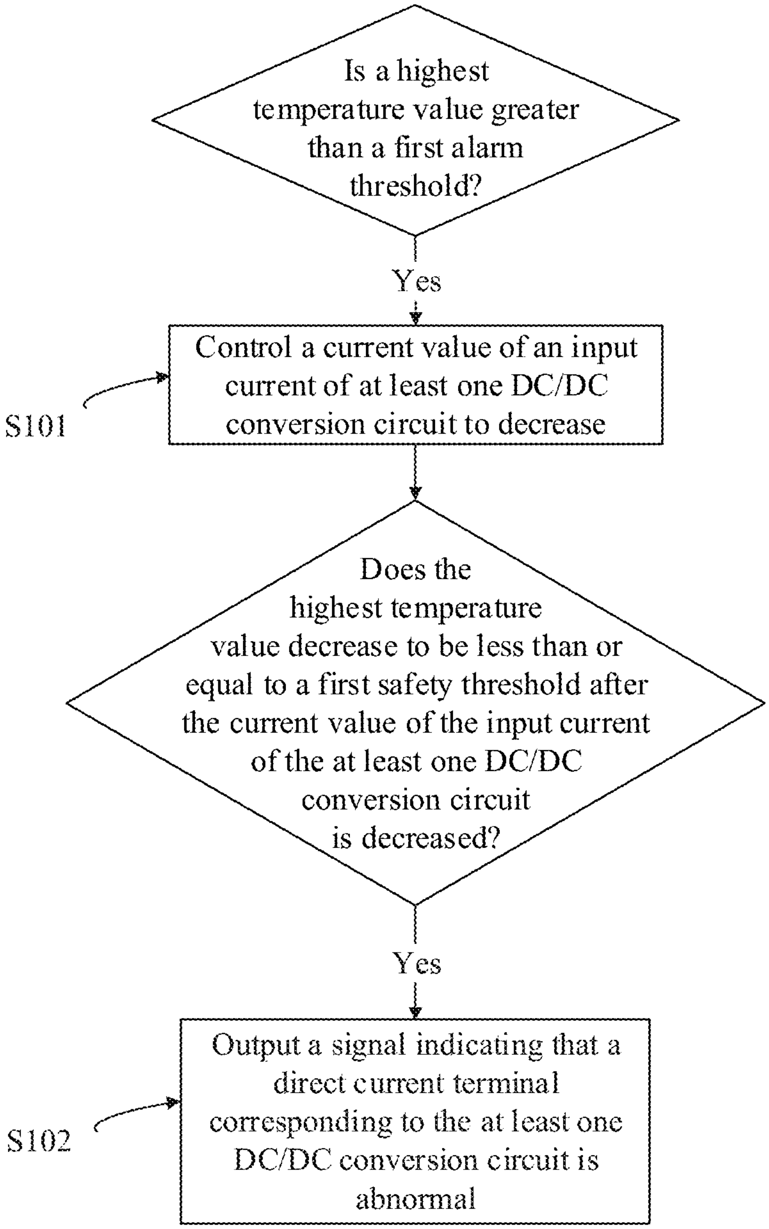
FIG. 8 is a schematic flowchart of determining of an abnormal terminal of a power converter according to an embodiment of this disclosure.

For a process of performing the method in the foregoing embodiment, refer to FIG. 8 in the accompanying drawings of this specification.

In another possible implementation provided in this embodiment of this disclosure, the method includes the following steps.

When a highest temperature value is greater than a first alarm threshold, step S201 is performed.

Step S201: Sequentially control current values of input currents of the plurality of DC/DC conversion circuits to decrease.

If the highest temperature value decreases to be less than or equal to a first safety threshold after a current value of an input current of an $n^{th}$ DC/DC conversion circuit is controlled to decrease, step S202 is performed.

Step S202: Output a signal indicating that the direct current terminal corresponding to the $n^{th}$ DC/DC conversion circuit is abnormal.

It should be noted that, after the signal indicating that the direct current terminal corresponding to the $n^{th}$ DC/DC conversion circuit is abnormal is output, abnormal terminal detection logic may continue to be performed on another direct current terminal, or may be stopped. This is not limited in this embodiment of this disclosure.

Figure 9:
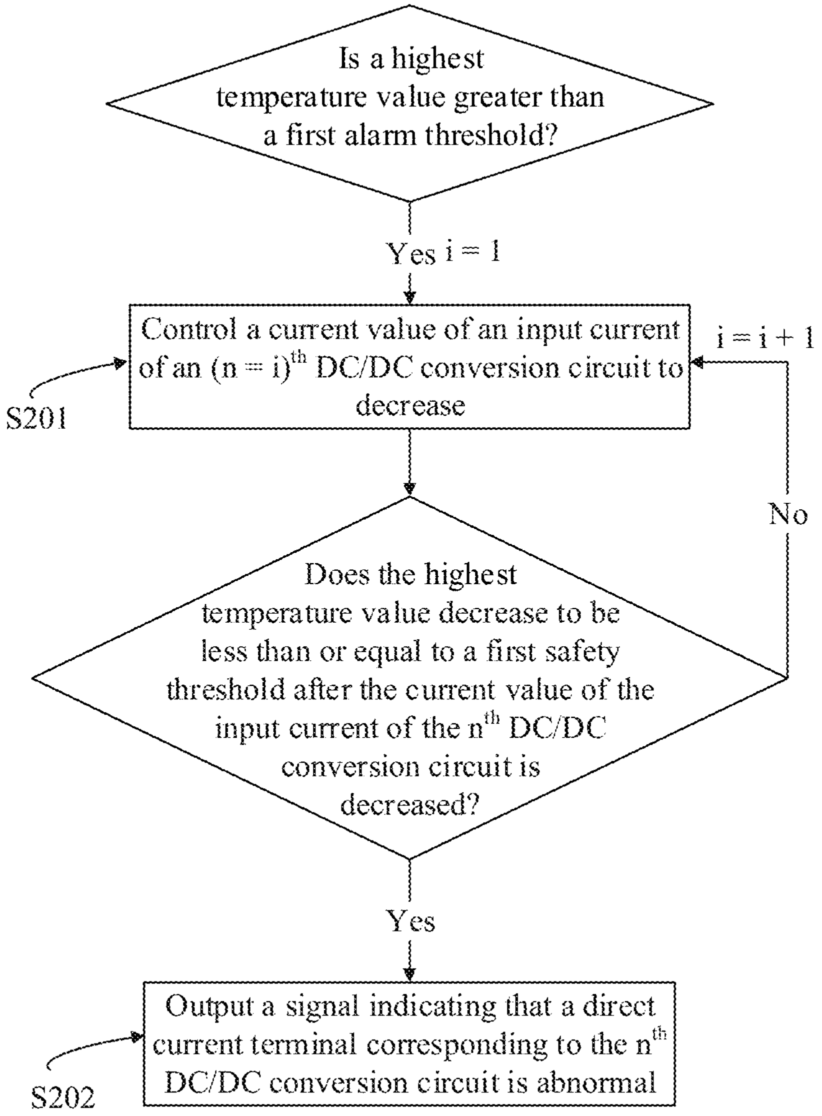
FIG. 9 is a schematic flowchart of determining of an abnormal terminal of a power converter according to an embodiment of this disclosure.

For a process of performing the method in the foregoing embodiment, refer to FIG. 9 in the accompanying drawings of this specification.

In another possible implementation provided in this embodiment of this disclosure, the method includes the following steps.

When a highest temperature value is greater than a second alarm threshold, step S301 is performed.

Step S301: Control current values of input currents of all DC/DC conversion circuits in the plurality of DC/DC conversion circuits to decrease.

After the highest temperature value decreases to be less than or equal to a second safety threshold, step S302 is performed.

Step S302: Control a current value of an input current of at least one DC/DC conversion circuit in the plurality of DC/DC conversion circuits to increase.

If the highest temperature value increases to be greater than the second alarm threshold after the current value of the input current of the at least one DC/DC conversion circuit is increased, step S303 is performed.

Step S303: Output a signal indicating that the direct current terminal corresponding to the at least one DC/DC conversion circuit is abnormal.

The second safety threshold is less than or equal to the second alarm threshold.

Figure 10:
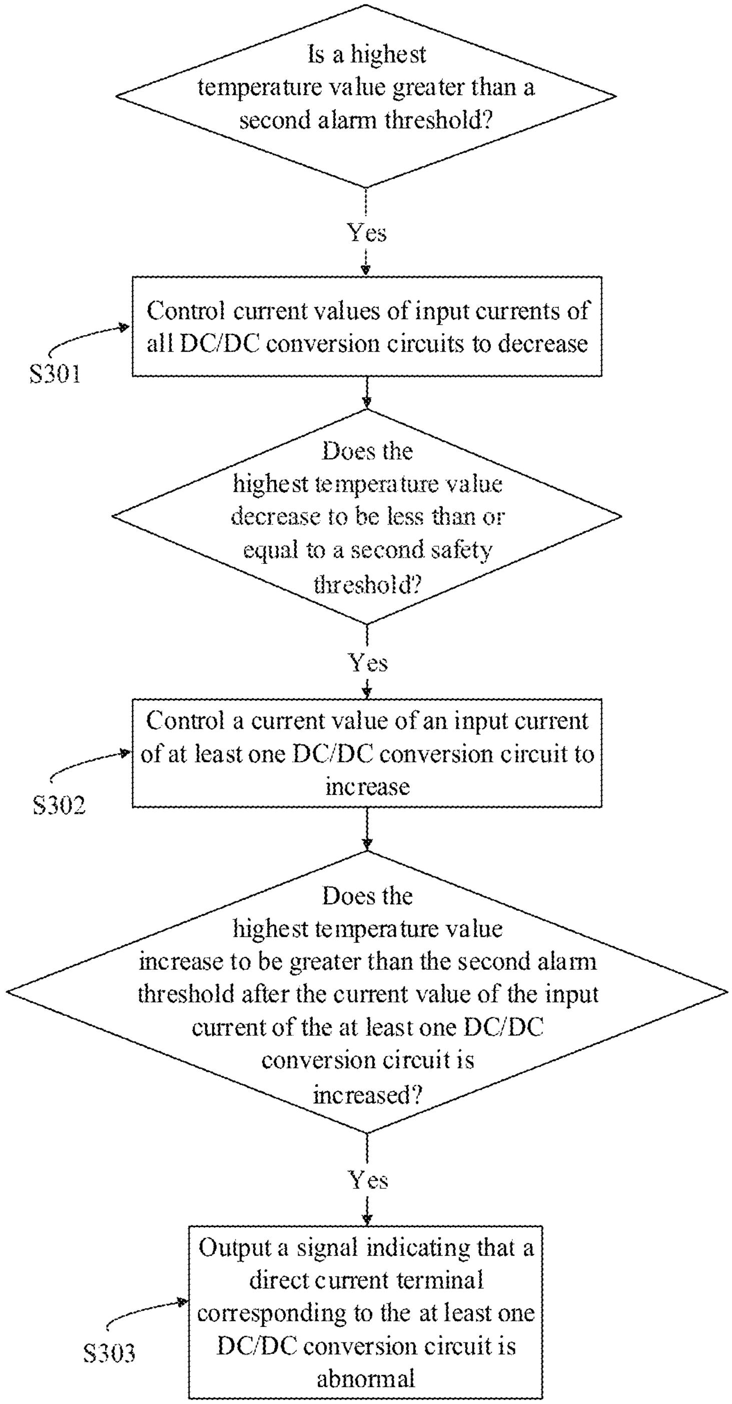
FIG. 10 is a schematic flowchart of determining of an abnormal terminal of a power converter according to an embodiment of this disclosure.

For a process of performing the method in the foregoing embodiment, refer to FIG. 10 in the accompanying drawings of this specification.

In another possible implementation provided in this embodiment of this disclosure, the method includes the following steps.

When a highest temperature value is greater than a second alarm threshold, step S401 is performed.

Step S401: Control current values of input currents of all DC/DC conversion circuits in the plurality of DC/DC conversion circuits to decrease, and after the highest temperature value decreases to be less than or equal to a second safety threshold, perform step S402.

Step S402: Sequentially control the current values of the input currents of the plurality of DC/DC conversion circuits to increase.

If the highest temperature value increases to be greater than the second alarm threshold within a second time threshold existing after a current value of an input current of an $m^{th}$ DC/DC conversion circuit is increased, step S403 is performed.

Step S403: Output a signal indicating that the direct current terminal corresponding to the $m^{th}$ DC/DC conversion circuit is abnormal.

It should be noted that, after the signal indicating that the direct current terminal corresponding to the $m^{th}$ DC/DC conversion circuit is abnormal is output, abnormal terminal detection logic may continue to be performed, or may be stopped. This is not limited in this embodiment of this disclosure.

Figure 11:
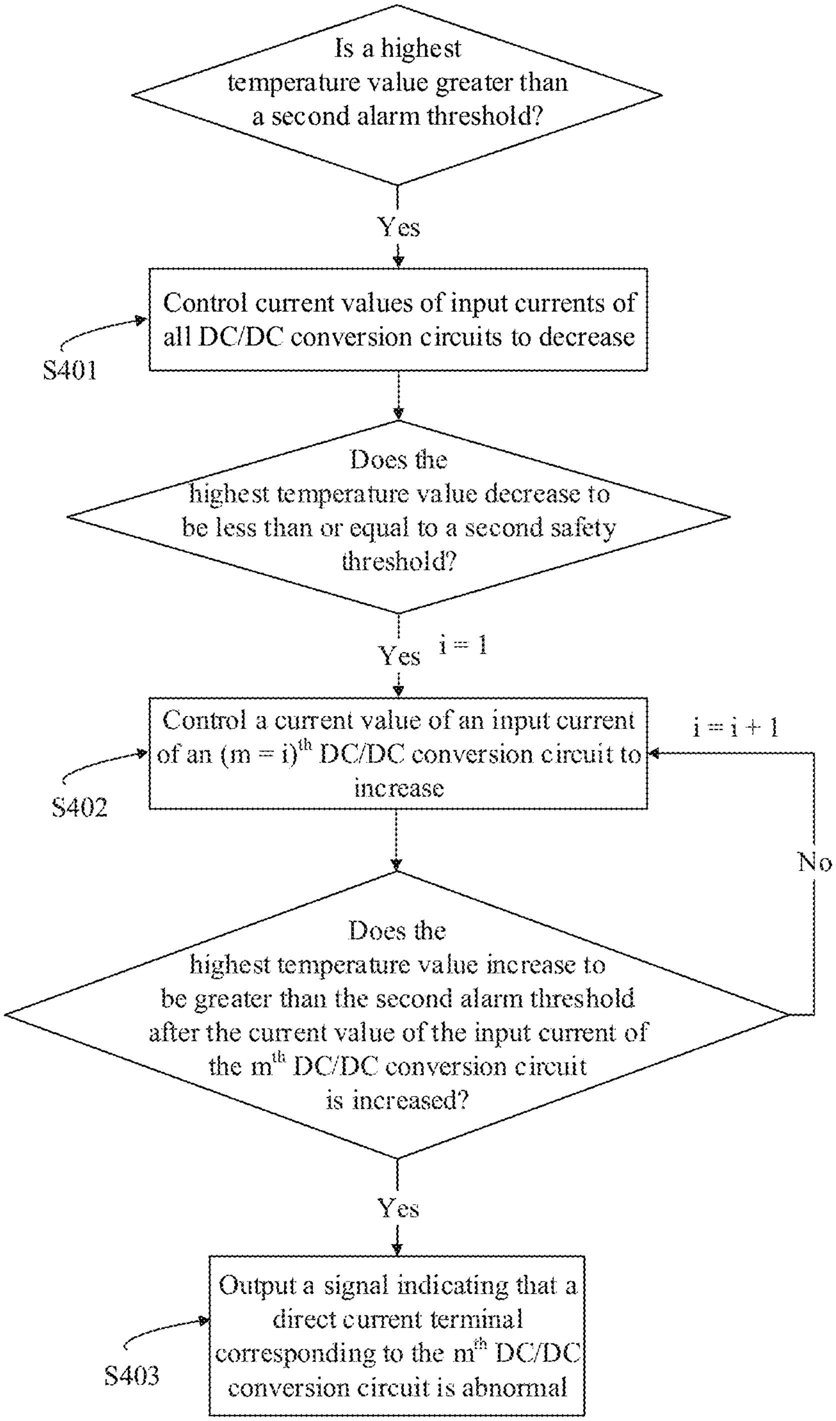
FIG. 11 is a schematic flowchart of determining of an abnormal terminal of a power converter according to an embodiment of this disclosure.

For a process of performing the method in the foregoing embodiment, refer to FIG. 11 in the accompanying drawings of this specification.

It should be understood that, for the foregoing method for detecting an abnormal terminal, reference may be made to determining logic performed by the controller 140 in the power converter 100 provided in this disclosure. For example, one first time threshold condition may be set between performing step S101 and step S102. If the highest temperature value decreases to be less than or equal to the first safety threshold within the first time threshold existing after the current value of the input current of the at least one DC/DC conversion circuit is decreased, determining logic of S102 is performed. If the first time threshold condition is not met, an abnormality determining process for a direct current terminal corresponding to the DC/DC conversion circuit may be stopped, and abnormality determining is performed on a direct current terminal corresponding to another DC/DC conversion circuit.

Further, when S201 is performed, a time interval between decreasing of current values of input currents of two DC/DC conversion circuits may be controlled to be greater than or equal to the first time threshold, so that sufficient time is reserved for the abnormality determining logic. For example, a time interval between a time when a current value of an input current of a $q^{th}$ DC/DC conversion circuit is decreased and a time when a current value of an input current of a $(q+1)^{th}$ DC/DC conversion circuit is controlled to decrease is greater than or equal to the first time threshold, where $1 \le q \le n-1$, and q is an integer.

Correspondingly, for performing step S301 to step S303 or performing step S401 to step S403, reference may be made to the determining logic performed by the controller 140 in the power converter 100 provided in this disclosure, as in the case of performing step S101 and step S102 and performing step S201 and step S202. Logic and principles of the steps are basically the same, and details are not described herein again.

It should be noted that when a power converter, including but not limited to the power converter 100 shown in FIG. 4 to FIG. 6 in accompanying drawings of this specification in the foregoing embodiments, further includes a fan, the method for detecting an abnormal terminal in the foregoing embodiment may further be performed in cooperation with rotation speed adjustment of the fan, to achieve an effect of detecting the abnormal terminal more quickly. A detailed method procedure is similar to specific control logic of the controller of the power converter 100 in the foregoing embodiment of this disclosure, and details are not described herein again.

Figure 12:
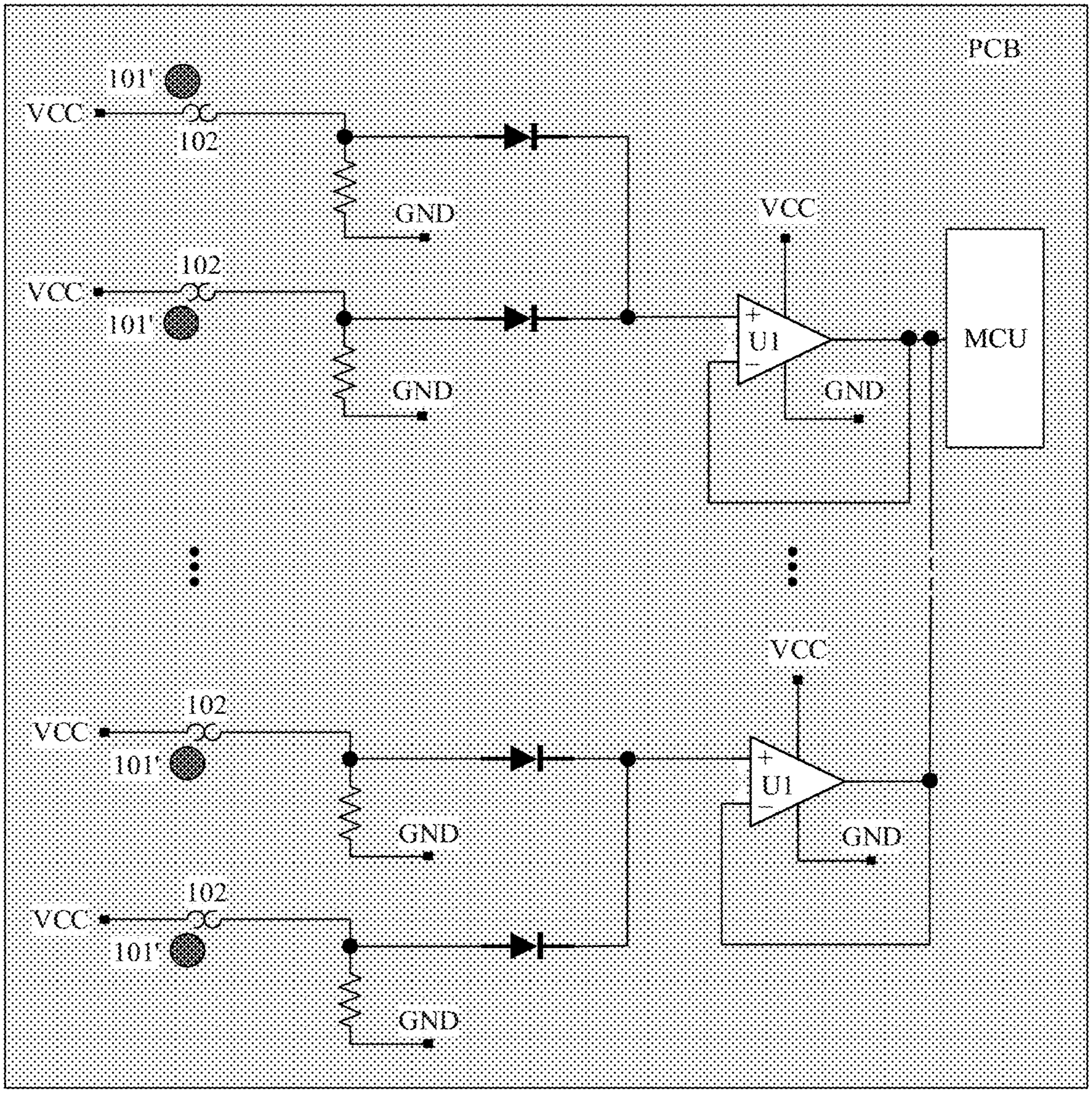
FIG. 12 is a schematic diagram of an abnormal terminal detection circuit of a power converter according to an embodiment of this disclosure.

A detection manner of a temperature of a direct current terminal 101 according to an embodiment of this disclosure is shown in FIG. 6 and FIG. 12. A plurality of temperature detection units, a plurality of DC/DC conversion circuits, and at least one DC/AC conversion circuit are incorporated into a PCB inside an inverter 100. Output ends 101' of a plurality of direct current terminals 101 of the inverter 100 are connected to the DC/DC conversion circuits by using the PCB, so that input of electric energy of an external direct current source is implemented.

As shown in FIG. 6, one end of the direct current terminal 101 is on a housing of the inverter 100, the output end 101' of the direct current terminal 101 is inserted into the PCB, and the temperature detection unit includes a plurality of temperature detection branches and operational amplifier circuits. Each temperature detection branch includes one temperature sensing element 102 configured to detect a temperature of the output end 101' of the direct current terminal 101, so that detection of the temperature of the direct current terminal 101 is implemented. The temperature sensing element 102 may be an element whose electrical performance changes with temperature, for example, an NTC or a thermocouple sensor. One end of the temperature sensing element 102 in each temperature detection branch is connected to a corresponding direct current source, the other end of the temperature sensing element 102 is connected to an input end of the operational amplifier circuit, and an output end of the operational amplifier circuit is connected to an input end of a controller. When the temperature of the direct current terminal 101 changes, the temperature of the output end 101' of the direct current terminal 101 changes, a temperature of the temperature sensing element 102 changes, and electrical performance of the temperature sensing element 102 changes, so that an electrical signal received by the operational amplifier circuit changes, an electrical signal received by the controller changes, and finally the controller identifies a temperature situation of the direct current terminal 101.

In an embodiment, still refer to FIG. 6. One end of the direct current terminal 101 is on a housing of the inverter 100, the output end 101' of the direct current terminal 101 is inserted into the PCB, and a temperature sensing element 102 is an NTC. The NTC 102 is placed near the output end 101' of the direct current terminal 101, and is configured to detect a temperature of the output end 101' of the direct current terminal 101. The temperature is approximately a temperature of the direct current terminal 101, and whether the temperature of the direct current terminal 101 is abnormal is determined based on the temperature.

It should be understood that, as a preset power of the inverter 100 increases, the inverter 100 needs more direct current input, a quantity of direct current terminals 101 increases, and more NTCs 102 are needed to perform temperature detection on the direct current terminals 101. For example, in a relatively refined detection requirement, each direct current terminal 101 needs to have one NTC 102 for performing temperature detection on the direct current terminal 101. As shown in FIG. 12, one NTC 102 is placed near each direct current terminal 101.

A specific principle of detecting a temperature by the NTC 102 is that a resistance value of the NTC 102 decreases as a temperature increases, and when a potential at one end of the NTC 102 is fixed, a potential at the other end of the NTC 102 is detected, so that whether the resistance value of the NTC 102 changes can be known, and whether a temperature of the NTC 102 changes may also be known. A temperature of the NTC 102 near the output end 101' of the direct current terminal 101, that is, the temperature of the NTC 102, can be approximately the temperature of the output end 101' of the direct current terminal 101.

Still refer to FIG. 12. One end of each NTC 102 is connected to the direct current source VCC and the other end is grounded by using a voltage divider resistor. A connection point between the NTC 102 and the voltage divider resistor is connected to a positive terminal of a diode, and a negative terminal of the diode is connected to a positive terminal of the operational amplifier circuit. For example, when a voltage of the direct current source VCC is 5 volts, (V), a resistance value of the voltage divider resistor is fixed, and the temperature of the direct current terminal 101 is normal, if the resistance value of the NTC 102 is equal to the resistance value of the voltage divider resistor, a potential of the connection point between the NTC 102 and the voltage divider resistor is 2.5 V. When situations, for example, connection to the direct current terminal 101 is loose, occur, the temperature of the direct current terminal 101 increases, the temperature of the NTC 102 increases, the resistance value of the NTC 102 decreases, and the potential of the connection point between the NTC 102 and the voltage divider resistor increases. In this case, the operational amplifier circuit senses that the potential of the connection point between the NTC 102 and the voltage divider resistor increases, and the operational amplifier circuit transmits the information to the controller micro controller unit (MCU). When the potential value increases to a preset threshold that is set in advance in the controller MCU, it indicates that the detected temperature of the direct current terminal 101 in the circuit reaches a first alarm threshold, and the controller MCU determines that the direct current terminal 101 detected by the NTC 102 connected to the operational amplifier circuit is abnormal.

Still refer to FIG. 12. In an embodiment, one operational amplifier circuit needs to receive electrical signals transmitted by two NTCs 102. In other words, two temperature detection branches are combined and then connected to a positive terminal of the operational amplifier circuit. Each of two direct current sources VCCs is connected to one end of each of two NTCs 102 near output ends 101' of direct current terminals 101, and the other end of each of the two NTCs 102 is grounded by using a corresponding voltage divider resistor. Connection points between the two NTCs 102 and the two voltage divider resistors are respectively connected to anodes of two diodes, and cathodes of the two diodes are connected and then connected to the positive terminal of the operational amplifier circuit. Because the diode is only conducted when a potential at the positive terminal is high and a potential at the negative terminal is low, a branch whose potential is higher after the two temperature detection branches transmits the electrical signal to the operational amplifier circuit. In other words, a branch with a direct current terminal 101 whose temperature is higher transmits the electrical signal to the operational amplifier circuit. In this design, detection precision is sacrificed a little, however, use of the operational amplifier circuit can be reduced, and hardware costs can be saved.

Figure 13:
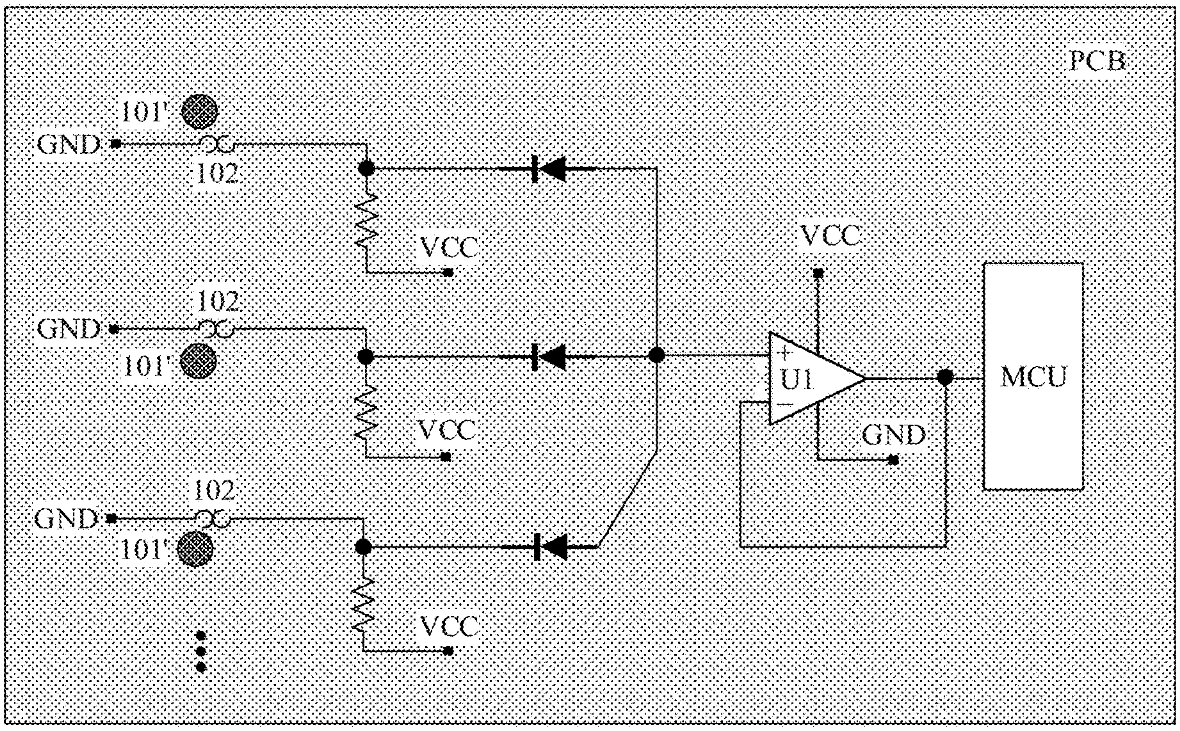
FIG. 13 is a schematic diagram of an abnormal terminal detection circuit of a power converter according to an embodiment of this disclosure.

Refer to FIG. 13. When accuracy of temperature detection does not need to be very high, a plurality of temperature detection branches may be combined and then connected to an operational amplifier circuit. Provided that one temperature in temperatures of direct current terminals 101 in the plurality of branches is excessively high, a controller MCU determines that the direct current terminal 101 detected by an NTC 102 connected to the operational amplifier circuit is abnormal.

Figure 14:
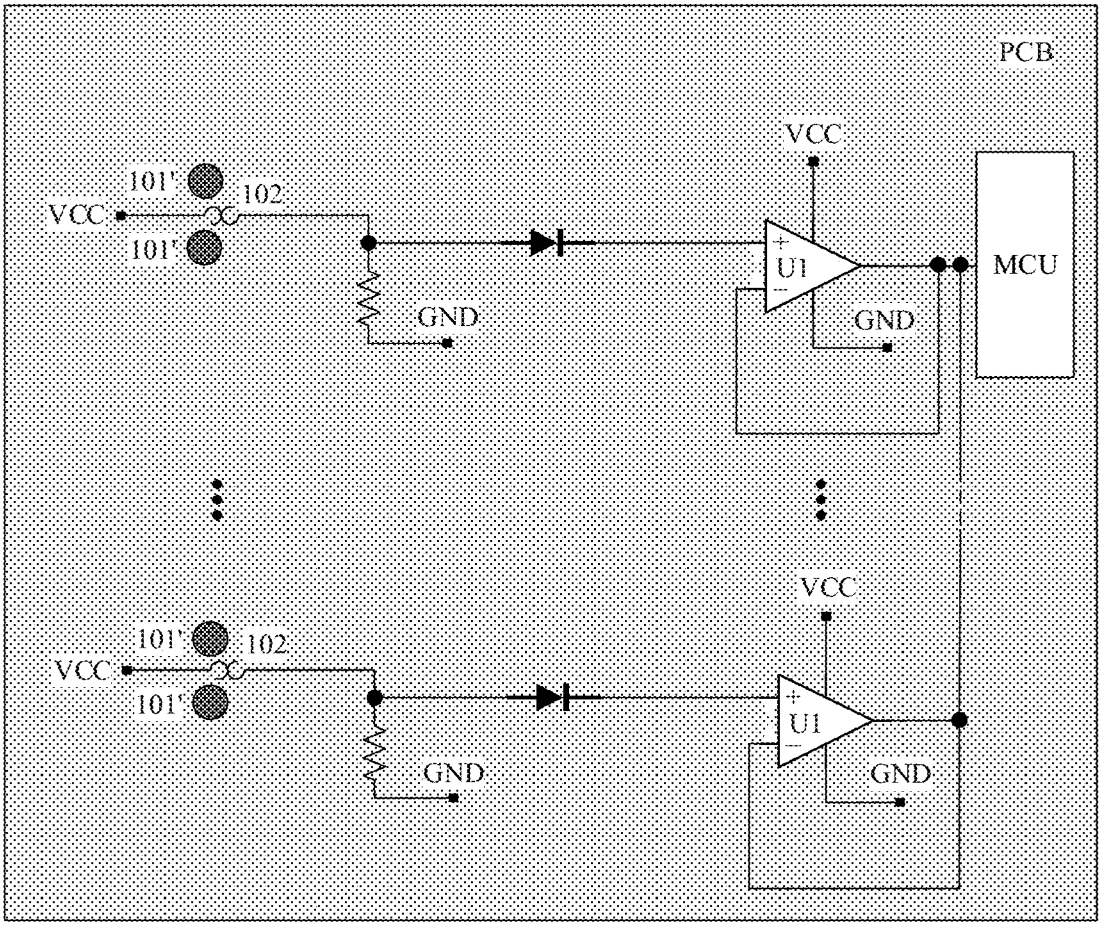
FIG. 14 is a schematic diagram of an abnormal terminal detection circuit of a power converter according to an embodiment of this disclosure.

Refer to FIG. 14. In another embodiment, one NTC 102 detects temperatures of output ends 101' of two direct current terminals 101 displaced adjacent to each other simultaneously. This reduces use of the NTC 102 and further saves hardware materials. It should be understood that, inserting positions of output ends 101' of the direct current terminals 101 on a PCB are designed to be adjacent to each other. In this way, the NTC 102 may be closely adjacent to output ends 101' of the two direct current terminals 101. A temperature of the NTC 102 is determined by a temperature of a direct current terminal 101 whose temperature is higher. When a temperature of any one of the direct current terminals 101 is abnormal, that is a detected temperature of the direct current terminal 101 reaches a first alarm threshold, a controller MCU may receive a corresponding signal to give an alarm.

Further, the controller MCU may be a same controller as a controller 140 in an inverter 100. When the controller 140 identifies that a specific direct current terminal 101 is abnormal, or that a terminal in several direct current terminals 101 is abnormal, that is when detected temperatures of one or several direct current terminals 101 reach the first alarm threshold, the controller 140 controls a DC/DC conversion circuit 110 correspondingly connected to the direct current terminals 101 and reduce an input current of the DC/DC conversion circuit 110, so that a current flowing through the direct current terminals 101 correspondingly connected to the DC/DC conversion circuit 110 is reduced, and temperatures of the direct current terminals 101 decrease.

In another possible implementation, when the controller 140 identifies that a specific direct current terminal 101 is abnormal, or a terminal in several direct current terminals 101 is abnormal, that is, when detected temperatures of one or several direct current terminals 101 reach the first alarm threshold, the controller 140 controls the DC/DC conversion circuit 110 that is correspondingly connected to the direct current terminals 101 and directly control the DC/DC conversion circuit 110 to not work, so that an input current of the DC/DC conversion circuit 110 is reduced to 0, a current flowing through the direct current terminals 101 correspondingly connected to the DC/DC conversion circuit 110 is 0, and temperatures of the direct current terminals 101 decrease.

Figure 15:
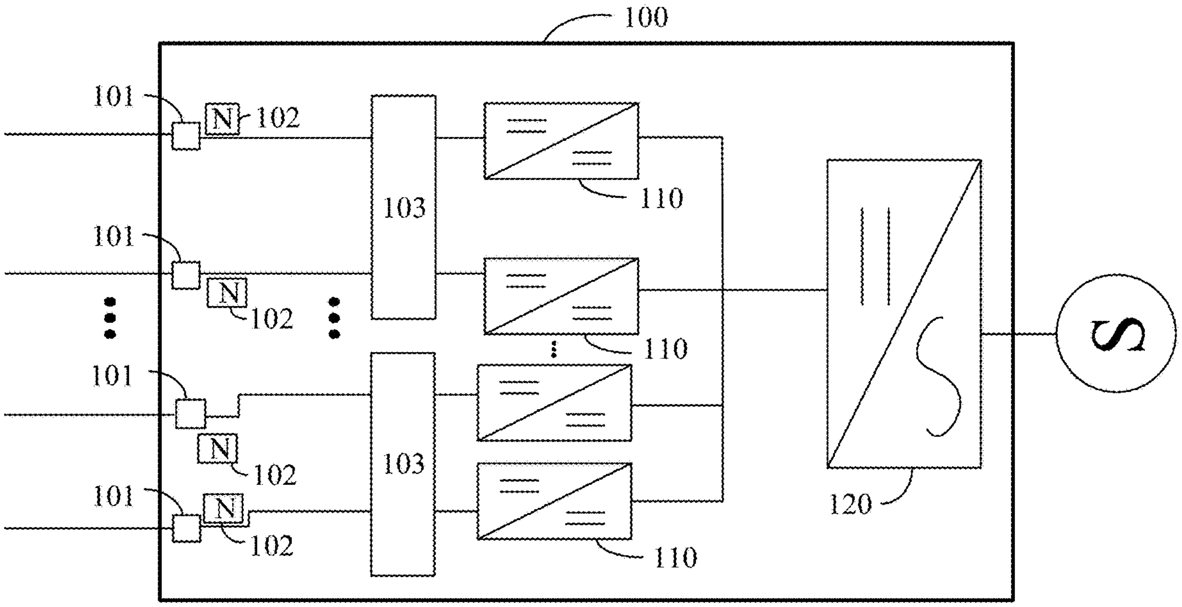
FIG. 15 is a schematic diagram of a structure of a circuit of a power converter according to an embodiment of this disclosure.

In still another possible implementation, refer to FIG. 15. An inverter 100 includes a plurality of direct current switches 103, and the direct current switch 103 is connected between a direct current terminal 101 and a DC/DC conversion circuit 110. The direct current switch 103 is correspondingly connected to two DC/DC conversion circuits 110, and each DC/DC conversion circuit 110 is correspondingly connected to a direct current input provided by five photovoltaic modules 200. A direct current input provided by each photovoltaic module 200 corresponds to two direct current terminals. In other words, each DC/DC conversion circuit 110 corresponds to 10 direct current terminals 101. In this way, the direct current switch 103 can synchronously manage a direct current input provided by the 10 photovoltaic modules 200 corresponding to the two DC/DC conversion circuits 110, that is, control electrical connection between 20 direct current terminals 101 and the two DC/DC conversion circuits 110. A controller 140 may control turn-on and turn-off of the direct current switch 103. When the controller 140 identifies that a specific direct current terminal 101 is abnormal, or a direct current terminal in several direct current terminals 101 is abnormal, the controller 140 may directly control the direct current switch 103 to be turned off, so that input currents of the two DC/DC conversion circuits 110 are reduced to 0, so that currents flowing through the direct current terminals 101 that are correspondingly connected to the two DC/DC conversion circuits 110 are 0, and the temperatures of the direct current terminals 101 decrease.

Embodiments of this disclosure are described in detail above. The principle and implementation of this disclosure are described herein by using specific examples. The description of the foregoing embodiments is merely provided to help understand the method and core ideas of this disclosure. In addition, a person of ordinary skill in the art can make variations and modifications to this disclosure in terms of the specific implementations and application scopes according to the ideas of this disclosure. Therefore, the content of this specification shall not be construed as a limit to this disclosure.

What is claimed is:

1. A power converter, comprising:

a plurality of direct current terminals comprising:
  first input ends configured to connect to a first direct current source; and
  first output ends;

a printed circuit board (PCB) comprising a plurality of first connection points connected to the first output ends;

a plurality of direct current/direct current (DC/DC) conversion circuits comprising:
  second input ends connected to the plurality of first connection points; and
  second output ends;

a direct current/alternating current (DC/AC) conversion circuit comprising:
  a third input end connected to the second output ends; and
  a third output end configured to connect to a load;

a plurality of temperature detectors, wherein each of the plurality of temperature detectors and one or two of the first connection points are disposed alternately on the PCB, and wherein the plurality of temperature detectors is configured to detect first temperatures of the plurality of direct current terminals; and a controller configured to:

control, in response to a highest temperature value in the first temperatures being greater than a first alarm threshold, a first current value of a first input current of at least one of the plurality of DC/DC conversion circuits to decrease; and detect, based on a change in the highest temperature value after the first input current is decreased, whether one of the plurality of direct current terminals corresponding to the at least one of the plurality of DC/DC conversion circuits is abnormal.

2. The power converter of claim 1, wherein the controller is further configured to output, in response to the highest temperature value decreasing to be less than or equal to a first safety threshold after the first current value is decreased, a signal indicating that the one of the plurality of direct current terminals corresponding to the at least one of the plurality of DC/DC conversion circuits is abnormal, and wherein the first safety threshold is less than or equal to the first alarm threshold.

3. The power converter of claim 2, wherein the controller is further configured to further control the first current value to decrease after outputting the signal.

4. The power converter of claim 1, wherein the controller is further configured to:

control, in response to the highest temperature value being greater than a second alarm threshold, second current values of second input currents of all of the plurality of DC/DC conversion circuits to decrease;

control, in response to the highest temperature value decreasing to be less than or equal to a second safety threshold, the first current value to increase; and output, in response to the highest temperature value increasing to be greater than the second alarm threshold after the first current value is increased, a signal indicating that the one of the plurality of direct current terminals corresponding to the at least one of the plurality of DC/DC conversion circuits is abnormal, wherein the second safety threshold is less than or equal to the second alarm threshold.

5. The power converter of claim 4, further comprising a fan, wherein the power converter is further configured to:

control, in response to the highest temperature value decreasing to be less than or equal to the second safety threshold, a rotation speed of the fan to decrease; and control the first current value to increase.

6. The power converter of claim 5, wherein the controller is further configured to control the first current value to increase by sequentially controlling the first current value to increase.

7. The power converter of claim 1, further comprising a fan, wherein the power converter is further configured to:

control, in response to the highest temperature value being greater than the first alarm threshold, a rotation speed of the fan to increase in order to decrease the highest temperature value to be less than the first alarm threshold;

control the rotation speed to decrease; and control, in response to the highest temperature value returning to the first alarm threshold, the first current value to decrease.

8. The power converter of claim 1, further comprising a fan, wherein the power converter is further configured to:

control, in response to the highest temperature value being greater than a second alarm threshold, second current values of second input currents of all of the plurality of DC/DC conversion circuits in the plurality of DC/DC conversion circuits to decrease; and control a rotation speed of the fan to increase.

9. The power converter of claim 1, wherein the controller is further configured to control the first current value to decrease by sequentially controlling the first current value to decrease.

10. The power converter of claim 1, wherein the plurality of temperature detectors, the plurality of DC/DC conversion circuits, and the at least one DC/AC conversion circuit are integrated into the PCB, wherein the first output ends are electrically connected, by using the PCB, to the plurality of DC/DC conversion circuits, wherein the plurality of temperature detectors comprises a plurality of temperature detection branches and a plurality of operational amplifier circuits, wherein each of the plurality of temperature detection branches comprises a second direct current source and a temperature sensing element, wherein the second direct current source and the temperature sensing element of each temperature detection branch are connected to each other in a one-to-one correspondence, wherein the second direct current source is connected to a first end of the temperature sensing element, wherein a second end of the temperature sensing element is connected to a fourth input end of the operational amplifier circuit, and wherein a fourth output end of the operational amplifier circuit is connected to a signal input end of the controller.

11. The power converter of claim 10, wherein the temperature sensing element is a negative temperature coefficient (NTC) thermistor, wherein the temperature detection branch further comprises a voltage divider resistor and a first diode, wherein the second direct current source, the temperature sensing element, the voltage divider resistor, and the first diode of each temperature detection branch are connected to each other in a one-to-one correspondence, wherein the second direct current source is connected to a third end of the NTC thermistor, wherein a fourth end of the NTC thermistor is grounded by using the voltage divider resistor, wherein the fourth end is further connected to a positive electrode of the first diode, wherein a negative electrode of the first diode is connected to a positive input end of the operational amplifier circuit, and wherein a negative input end of the operational amplifier circuit is connected to the fourth output end.

12. The power converter of claim 11, wherein the NTC thermistor of each temperature detection branch is disposed adjacent to a fifth output end of at least one corresponding direct current terminal in the first output ends, wherein the NTC thermistor is configured to reduce a resistance value when a second temperature of the fifth output end increases in order to increase a potential value of a second connection point between the NTC thermistor and the voltage divider resistor, wherein the potential value and the second temperature are in a one-to-one correspondence, and wherein the controller is further configured to send an alarm signal when the potential value in any one of the temperature detection branches is greater than the first alarm threshold.

13. The power converter of claim 11, wherein the NTC thermistor of each temperature detection branch is disposed adjacent to fifth output ends of two corresponding direct current terminals in the first output ends, and wherein the NTC thermistor is configured to reduce a resistance value when second temperatures of the first output ends increase in order to increase a potential value of a second connection point between the NTC thermistor and the voltage divider resistor.

14. The power converter of claim 11, wherein a first negative electrode of the first diode of each of the plurality of temperature detection branches is connected to a second negative electrode of a second diode of an adjacent temperature detection branch.

15. The power converter of claim 1, further comprising a plurality of direct current switches, wherein each direct current switch is connected between two or more of the plurality of direct current terminals and two of the plurality of DC/DC conversion circuits corresponding to the two or more of the plurality of direct current terminals, and wherein the controller is further configured to control, when one of the first temperatures of one of the plurality of direct current terminals is greater than the first alarm threshold, one of the plurality of direct current switches connected to the one of the plurality of direct current terminals to be turned off.

16. The power converter of claim 1, wherein the controller is further configured to:

control, when one of the first temperatures of one of the plurality of direct current terminals is greater than the first alarm threshold, the first input current of the at least one of the plurality of DC/DC conversion circuits connected to the one of the plurality of direct current terminals to decrease; or control, when the one of the first temperatures is greater than the first alarm threshold, the first input current of the at least one of the plurality of DC/DC conversion circuits connected to the one of the plurality of direct current terminals to be 0.

17. A method, comprising:

detecting temperatures of a plurality of direct current terminals;

controlling, in response to a highest temperature value in the temperatures being greater than a first alarm threshold, a first current value of a first input current of at least one of a plurality of direct current/direct current (DC/DC) conversion circuits to decrease; and detecting, based on a change in the highest temperature value after the first input current is decreased, whether one of the plurality of direct current terminals corresponding to the at least one of the plurality of DC/DC conversion circuits is abnormal.

18. The method of claim 17, further comprising one of:

outputting, in response to the highest temperature value decreasing to be less than or equal to a first safety threshold after the first current value is decreased, a first signal indicating that one of the plurality of direct current terminals corresponding to the at least one of the plurality of DC/DC conversion circuits is abnormal, wherein the first safety threshold is less than or equal to the first alarm threshold; or controlling, in response to the highest temperature value being greater than a second alarm threshold, second current values of second input currents of all of the plurality of DC/DC conversion circuits to decrease; controlling, in response to the highest temperature value decreasing to be less than or equal to a second safety threshold, the first current value to increase; and outputting, in response to the highest temperature value increasing to be greater than the second alarm threshold after the first current value is increased, a second signal indicating that the one of the plurality of direct current terminals corresponding to the at least one of the plurality of DC/DC conversion circuits is abnormal, wherein the second safety threshold is less than or equal to the second alarm threshold.

19. The method of claim 17, further comprising one of:

controlling, in response to the highest temperature value being greater than the first alarm threshold, a rotation speed of a fan to increase in order to decrease the highest temperature value to be less than the first alarm threshold; controlling the rotation speed to decrease; and controlling, in response to the highest temperature value returning to the first alarm threshold, the first current value to decrease; or controlling, in response to the highest temperature value being greater than a second alarm threshold, second current values of second input currents of all of the plurality of DC/DC conversion circuits to decrease; and controlling the rotation speed to increase.

20. A computer program product comprising instructions stored on a non-transitory computer-readable medium that, when executed by a processor, cause a power converter to:

detect temperatures of a plurality of direct current terminals;

control, in response to a highest temperature value in the temperatures being greater than a first alarm threshold, a first current value of a first input current of at least one of a plurality of direct current/direct current (DC/DC) conversion circuits to decrease; and detect, based on a change in the highest temperature value after the first input current is decreased, whether one of the plurality of direct current terminals corresponding to the at least one of the plurality of DC/DC conversion circuits is abnormal.

* * * * *